US008698504B2

United States Patent
Wei et al.

(10) Patent No.: US 8,698,504 B2
(45) Date of Patent: Apr. 15, 2014

(54) SYSTEM FOR DETECTION OF A GROUND FAULT IN A HIGH RESISTANCE GROUND NETWORK

(75) Inventors: Lixiang Wei, Whitefish Bay, WI (US); Zhijun Liu, Menomonee Falls, WI (US); Brian Patrick Brown, Mayville, WI (US); David W. Kirschnik, Germantown, WI (US); Russ J. Kerkman, Milwaukee, WI (US); Richard A. Lukaszewski, New Berlin, WI (US); Gary Skibinski, Milwaukee, WI (US); Carlos Daniel Rodriguez-Valdez, Glendale, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 484 days.

(21) Appl. No.: 12/901,512

(22) Filed: Oct. 9, 2010

(65) Prior Publication Data

US 2012/0086458 A1  Apr. 12, 2012

(51) Int. Cl.
  *G01R 31/14* (2006.01)
(52) U.S. Cl.
  USPC ........... 324/509; 324/500; 324/512; 324/521; 324/522
(58) Field of Classification Search
  USPC ......... 324/500, 509, 512, 521, 522, 528, 520, 324/525, 510; 702/58
  See application file for complete search history.

(56) References Cited

U.S. PATENT DOCUMENTS

| | | | |
|---|---|---|---|
| 4,878,142 A | 10/1989 | Bergman et al. | |
| 5,786,708 A * | 7/1998 | Premerlani et al. | 324/765.01 |
| 6,421,618 B1 * | 7/2002 | Kliman et al. | 361/42 |
| 6,977,518 B2 * | 12/2005 | Higashihama et al. | 324/764.01 |
| 7,154,277 B2 | 12/2006 | Vallinmaki et al. | |
| 2004/0227521 A1 * | 11/2004 | Higashihama et al. | 324/522 |
| 2008/0180087 A1 * | 7/2008 | Pankau et al. | 324/76.74 |
| 2009/0080127 A1 * | 3/2009 | Mirafzal | 361/42 |
| 2009/0147415 A1 * | 6/2009 | Lazarovich et al. | 361/42 |
| 2011/0304339 A1 * | 12/2011 | Schumacher et al. | 324/509 |

OTHER PUBLICATIONS

Tallam et al., "Failure Mode for AC Drives on High Resistance Grounded Systems", IEEE APEC 2006, Dallas (TX), Mar. 19-23, 2006, pp. 1587-1591.*

* cited by examiner

*Primary Examiner* — Huy Q Phan
*Assistant Examiner* — James Split
(74) *Attorney, Agent, or Firm* — Fletcher Yoder, P.C.; Alexander R. Kuszewski; John M. Miller

(57) ABSTRACT

A method is provided for detection of a ground fault in a high resistance network in a voltage source power conversion circuit comprising a power converter that converts incoming AC power to DC power applied to a DC bus and an inverter that converts DC power from the DC bus to output AC power. The method includes detecting a midpoint-to-ground voltage between a low side of the DC bus and a ground potential and detecting the presence of a ground fault in a high resistance network based upon the detected midpoint-to-ground voltage.

10 Claims, 5 Drawing Sheets

SYSTEM FOR DETECTION OF A GROUND FAULT IN A HIGH RESISTANCE GROUND NETWORK

BACKGROUND

The invention relates generally to power conversion circuits and, particularly to a system for detection of a ground fault in a high resistance ground network system.

Wide ranges of equipment utilizing various power converter circuits are known, such as electric motor drive systems used in factory automation systems, power generation systems and so forth. Typically an electric motor drive is connected to a power source, most often the power grid, and operates to provide electrical power to a load in a controlled manner.

In voltage power conversion circuits, electrical power is converted from an AC power source into direct current (DC) power via a power converter. The DC power is then converted via an inverter coupled to the converter through a DC bus into AC power with controlled frequency, phase and amplitude, which may be applied to drive an external load such as the electric motor.

Typically, it is desirable to detect whether a drive is operating in a ground fault on a high resistance ground network so that the ground fault may be cleared before it causes failures in components of the circuit. In operation, the bus voltages increase substantially during a ground fault resulting in high voltage stresses in the components such as motor and cables of the system. Because of the high resistance that normally exists during the ground faults on high resistance ground networks, the fault current is small and therefore often negligible thereby making it difficult to reliably separate such faults from large changes of the load.

Most conventional techniques for detecting ground faults on high resistance ground networks are based on simplified impedance models for the transmission line. However, these techniques lack sufficient accuracy when applied to systems containing power converters. Another way of detecting ground faults on high resistance ground networks is by measuring output phase to ground voltage in the circuit. However, such technique is complicated and can identify only output phase to ground fault.

Accordingly, it would be desirable to develop a system that detects presence and location of ground faults on high resistance ground networks in power conversion circuits during and/or prior to operation of such systems.

BRIEF DESCRIPTION

Briefly, according to one embodiment of the present invention, a method is provided for detection of a ground fault in a high resistance ground network in a voltage source power conversion circuit comprising a power converter that converts incoming AC power to DC power and an inverter that converts the DC power to output AC power. The method includes detecting a midpoint-to ground voltage between a low side of the DC bus and a ground potential and detecting the presence of a ground fault in a high resistance network based upon the detected midpoint-to-ground voltage.

In accordance with another aspect, a system is provided for detection of ground fault in high resistance network. The system includes an amplifier configured to be coupled to a side of a DC bus to detect a voltage at a node between the midpoint of the DC bus and a ground potential. The system also includes a low pass filter coupled to an output of the amplifier to generate a midpoint-to-ground signal In accordance with another aspect, a system is provided for detection of a ground fault in a high resistance ground network. The system includes a voltage source power conversion circuit comprising a power converter that converts incoming AC power to DC power applied to a DC bus and an inverter that converts DC power from the DC bus to output AC power. The system also includes a midpoint-to-ground voltage detection circuit coupled to a low side of the DC bus and to a ground potential and configured to generate a midpoint-to-ground voltage signal and a monitoring and analysis circuit coupled to the midpoint-to-ground voltage detection circuit and configured to detect a ground fault in a high resistance network based upon the midpoint-to-ground voltage signal.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in detail below, embodiments of the present technique function to provide a system for detection of a ground fault in a high resistance ground network in a power conversion circuit such as employed in motor drive systems. In particular, the present technique provides off-line and on-line detection techniques to detect presence and location of the ground fault (such as load side, DC side or AC input side) based upon a measured midpoint-to-ground voltage.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
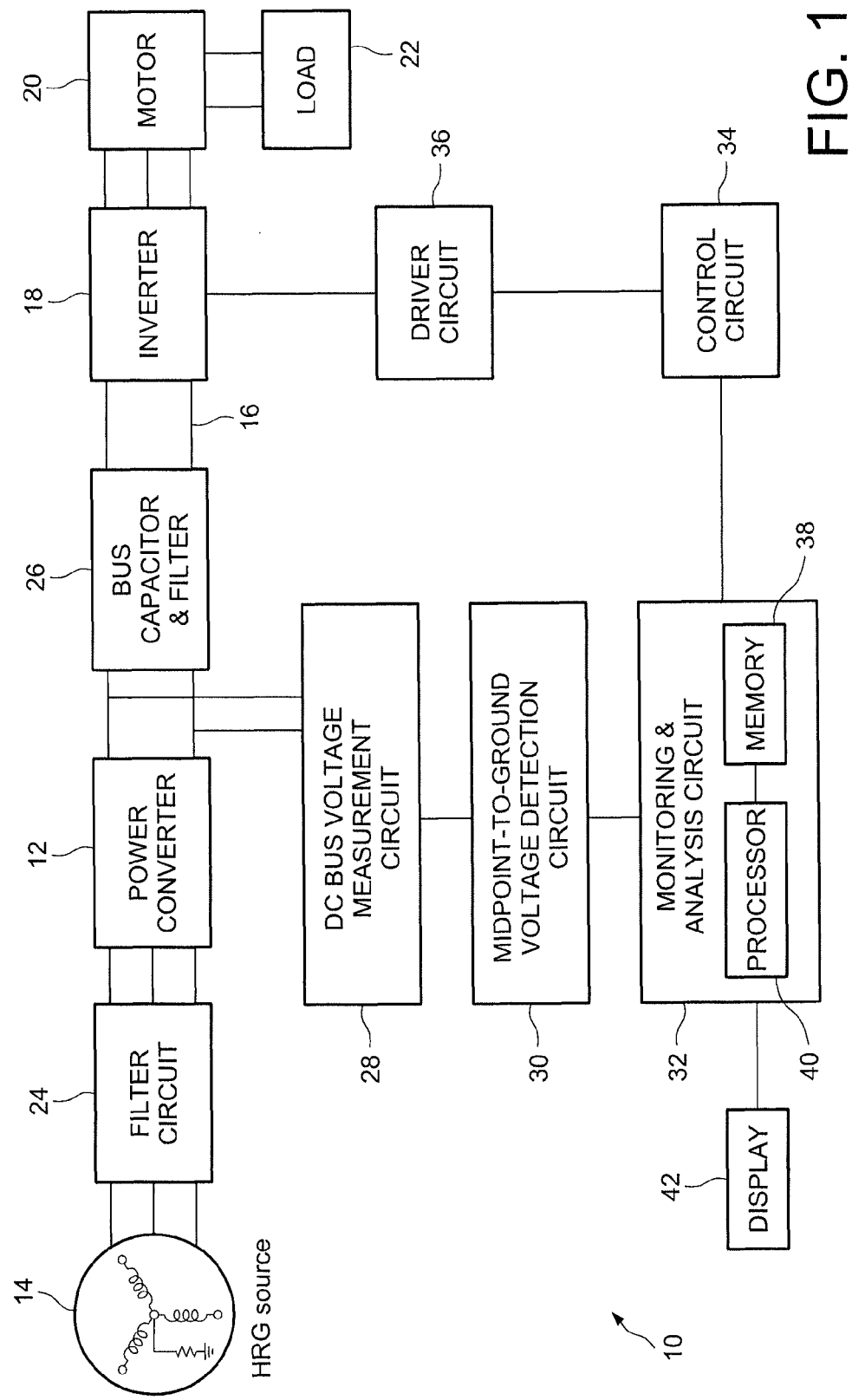
FIG. 1 illustrates an exemplary voltage power conversion circuit with a system for detecting a ground fault in a high resistance network in accordance with aspects of the present invention.

Turning now to drawings and referring first to FIG. 1, a voltage power conversion circuit 10 is illustrated. The voltage power conversion circuit 10 includes a power converter 12 configured to receive incoming AC power from a power source 14 and to convert the AC power to DC power applied to a DC bus 16. The voltage power conversion circuit 10 also includes an inverter 18 coupled to the power converter 12 that converts DC power from the DC bus 16 to output AC power. Further, a motor 20 is coupled to and driven by the inverter 18. In the illustrated embodiment, the voltage power conversion circuit 10 further includes a load 22 coupled to and driven by the motor 20.

In the illustrated embodiment, the voltage power conversion circuit 10 includes filter circuitry 24 for filtering higher order harmonics from AC power received from the power source 14. In certain embodiments, the filter circuitry 24 includes an electromagnetic interference and harmonic filter. Further, the voltage power conversion circuit 10 includes bus capacitor and filter 26 configured to filter harmonics associated with the DC bus 16.

In the illustrated embodiment, the voltage power conversion circuit 10 further includes a DC bus voltage measurement circuit 28 configured to measure the DC bus voltage. Moreover, a midpoint-to-ground voltage detection circuit 30 is coupled to the DC bus voltage measurement circuit 28. In a presently contemplated configuration, the midpoint-to-ground voltage detection circuit 30 is coupled to a midpoint of the DC bus 16 and to a ground potential and is configured to generate a midpoint-to-ground voltage signal. The voltage power conversion circuit 10 also includes a monitoring and analysis circuit 32 coupled to the midpoint-to-ground voltage detection circuit 30 and configured to detect a ground fault in a high resistance network based upon the midpoint-to-ground voltage signal.

It should be noted that, while the present techniques for detecting ground fault in high resistance ground network are described in connection with a motor drive, the techniques are not limited to such applications. Rather, the same methodology may be utilized for detecting ground faults in a wide range of circuit applications, particularly those in which a DC bus is used in conjunction with AC/DC rectification, or more generally conversion circuitry, and DC/AC conversion circuitry.

In one embodiment, the monitoring and analysis circuit 32 is configured to detect the ground fault in a high resistance network prior to applying the power to the load 22. In operation, the monitoring and analysis circuit 32 is configured to determine whether the detected midpoint-to-ground voltage exhibits a line side fundamental frequency component indicative of a line side ground fault. In another exemplary embodiment, the monitoring and analysis circuit 32 is configured to determine whether the detected midpoint-to-ground voltage exhibits a DC offset component indicative of a DC bus ground fault.

In another exemplary embodiment, the monitoring and analysis circuit 32 is configured to determine whether the detected midpoint-to-ground voltage exhibits a DC offset component while placing all high side switches or low side power electronic switches of the inverter 18 into a conducting state. In this exemplary embodiment, the voltage power conversion circuit 10 includes a control circuit 34 and a driver circuit 36 for controlling operation of the power electronic switches of the inverter 18.

In another exemplary embodiment, the monitoring and analysis circuit 32 is configured to detect the ground fault in a high resistance network during driving of the load 22 with the output AC power. In this exemplary embodiment, the monitoring and analysis circuit 32 is configured to detect a line side fundamental frequency component of the midpoint-to-ground voltage indicative of a line side ground fault. Moreover, the monitoring and analysis circuit 32 is configured to detect a DC offset component of the midpoint-to-ground voltage indicative of a DC bus ground fault. In addition, the monitoring and analysis circuit 32 is configured to detect an output frequency component of the midpoint-to-ground voltage indicative of a load side ground fault.

In the illustrated embodiment, monitoring and analysis circuit 32 includes a memory 38 configured to store the detected midpoint-to-ground voltage. Further, the monitoring and analysis circuit 32 also includes a processor 40 configured to determine components such as line side fundamental frequency component of the midpoint-to-ground voltage signal, DC offset component of the midpoint-to-ground voltage signal and output frequency component of the midpoint-to-ground voltage signal to detect the line side ground fault, the DC bus ground fault and the load side ground fault respectively.

The memory 38 may include hard disk drives, optical drives, tape drives, random access memory (RAM), read-only memory (ROM), programmable read-only memory (PROM), redundant arrays of independent disks (RAID), flash memory, magneto-optical memory, holographic memory, bubble memory, magnetic drum, memory stick, Mylar® tape, smartdisk, thin film memory, zip drive, and so forth. In certain embodiments, the information about the detected ground fault in a high resistance network may be displayed to a user through a display 42.

It should be noted that the present invention is not limited to any particular processor for performing the processing tasks of the invention. The term "processor," as that term is used herein, is intended to denote any machine capable of performing the calculations, or computations, necessary to perform the tasks of the invention. The term "processor" is intended to denote any machine that is capable of accepting a structured input and of processing the input in accordance with prescribed rules to produce an output. It should also be noted that the phrase "configured to" as used herein means that the processor is equipped with a combination of hardware and software for performing the tasks of the invention, as will be understood by those skilled in the art.

Figure 2:
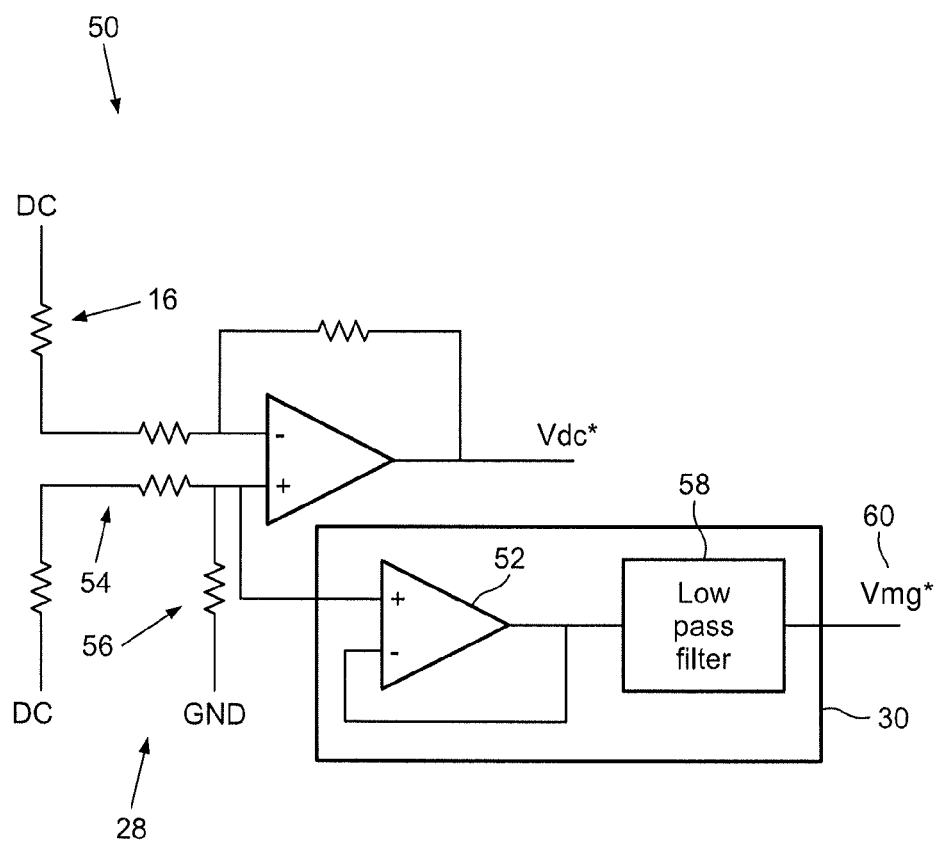
FIG. 2 illustrates an exemplary configuration of a DC bus voltage measurement circuit with a midpoint-to-ground voltage detection circuit employed in the voltage power conversion circuit of FIG. 1.

FIG. 2 illustrates an exemplary configuration 50 of the DC bus voltage measurement circuit 28 with the midpoint-to-ground voltage detection circuit 30 employed in the voltage power conversion circuit 10 of FIG. 1. In the presently contemplated configuration, the midpoint-to-ground voltage detection circuit 30 includes an amplifier 52 coupled to a low side 54 of the DC bus 16 to detect a voltage at a node between the low side 54 of the DC bus 16 and a ground potential 56. Moreover, a low pass filter 58 is coupled to an output of the amplifier 52 to generate a midpoint-to-ground voltage signal 60. In this exemplary embodiment, the low pass filter 58 is configured to filter switching ripples in the detected voltage and generate the midpoint-to-ground voltage signal 60.

As described before with reference to FIG. 1, the midpoint-to-ground voltage signal 60 is processed by the monitoring and analysis circuit 32 to detect the presence and location of the ground fault. In particular, the midpoint-to-ground voltage signal 60 is analyzed to determine line side fundamental frequency component of the midpoint-to-ground voltage signal 60, DC offset component of the midpoint-to-ground voltage signal 60 and output frequency component of the midpoint-to-ground voltage signal 60 to detect line side ground fault, DC bus ground fault and load side ground fault. It should be noted that the presence and location of the ground fault may be detected prior to or during driving of the load 22 with the output AC power that will be described in a greater detail below.

Figure 3:
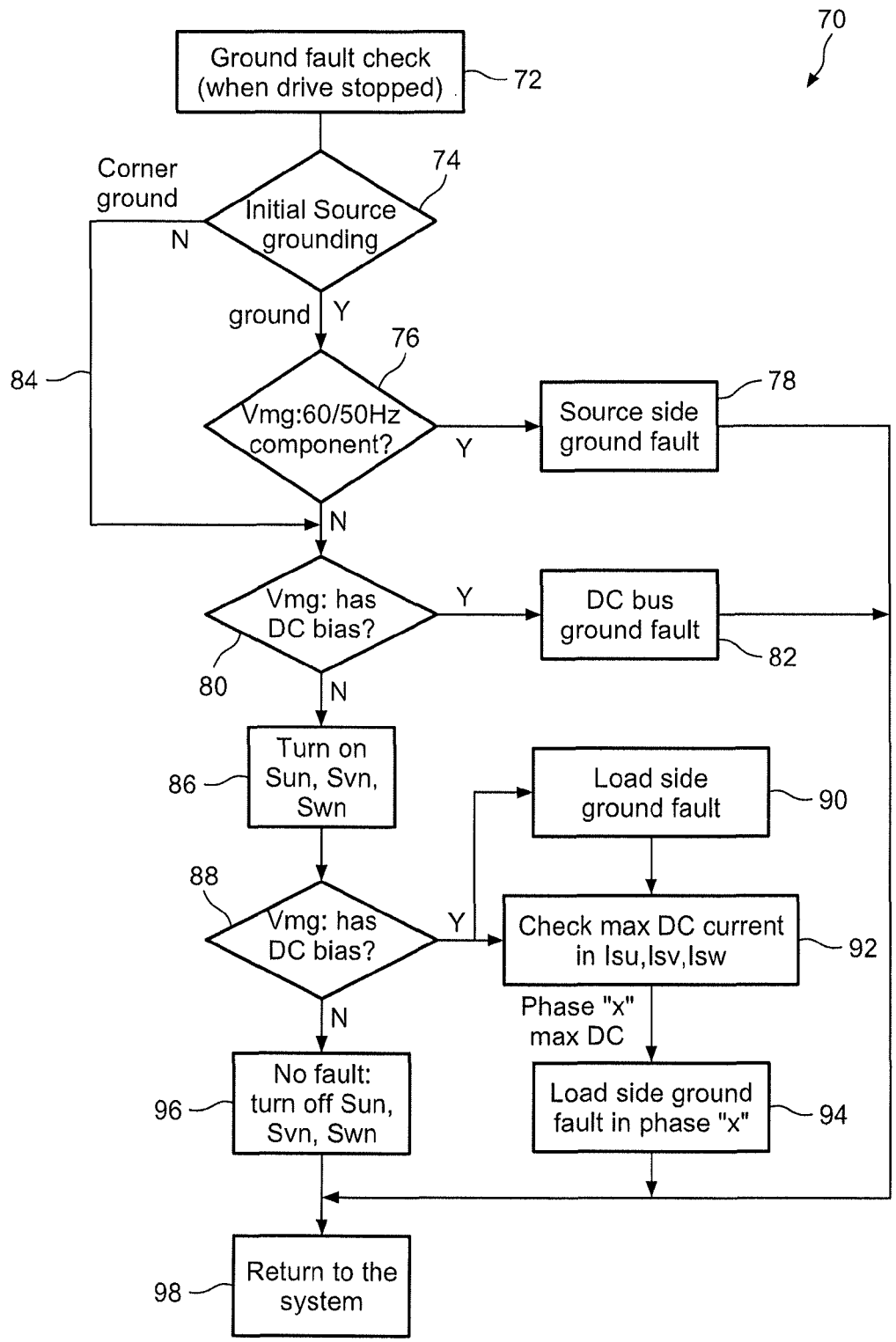
FIG. 3 illustrates exemplary process steps for detecting a high resistance fault in the voltage source power conversion circuit of FIG. 1 prior to powering a load of the circuit or removal of the load of the circuit.

FIG. 3 illustrates exemplary process steps 70 for detecting a high resistance fault in the voltage source power conversion circuit 10 of FIG. 1 prior to powering the load 22. At block 72, a ground fault check is initialized. In this exemplary embodiment, the inverter of the voltage source power conversion circuit is not operating and the load is not powered. At block 74, initial source grounding type is determined for the circuit 10. In certain embodiments, the initial source grounding may be specified by a user of the voltage source power conversion circuit 10.

If the circuit is identified as a Y grounded system, then it is determined if the midpoint-to-ground voltage exhibits a fundamental frequency component (block 76). In this exemplary embodiment, it is verified if the fundamental frequency of the midpoint-to-ground voltage is about 60 Hz (in North America). Further, if the detected fundamental frequency component of the midpoint-to-ground voltage is substantially same as of the input phase voltage, the fault is characterized as a source side ground fault (block 78).

Moreover, if the fundamental frequency component of the midpoint-to-ground voltage is different from the input phase voltage, then it is determined if the midpoint-to-ground voltage exhibits a DC offset component (block 80). In certain embodiments, the DC offset component of the midpoint-to-ground voltage is further determined for a corner grounded system (block 82). The DC offset component of the midpoint-to-ground voltage is compared with a pre-determined threshold to detect a DC bus ground fault, as represented by block 84.

In one exemplary embodiment, the DC offset component of the midpoint-to-ground voltage is approximated by the following equation:

$$V_{ng\_dc} \approx \frac{1}{2} \times V_{dc} \times R_{gnd}/(R_{gnd}+R_{flt}) \qquad (1)$$

where: $V_{mgdc}$ is the DC offset component of the midpoint-to-ground voltage, Vdc is the measured differential DC bus voltage, Rgnd is the neutral resistance, and Rflt is the ground fault resistance.

If the DC offset component of the midpoint-to-ground voltage has a substantially low value, then all high side or low side power electronic switches of the inverter are placed into a conducting state, as represented by block 86. Again, at block 88, the DC offset component of the midpoint-to-ground voltage is verified. In one exemplary embodiment, when all the power electronic switches are disabled, the midpoint-to-ground voltage does not exhibit a DC offset component.

If the DC offset component of the midpoint-to-ground voltage is higher than a pre-determined threshold then a load side ground fault is identified (block 90). Moreover, current components are checked, as represented by block 92, to detect which phase of the load is faulted. In this embodiment, the output load currents are represented by $I_{su}$, $I_{sv}$, and $I_{sw}$ respectively. For example, in the illustrated embodiment, the current component is substantially high in phase "x" indicative of a load side ground fault in phase "x" (block 94).

In another embodiment, if the value of the DC offset component of the midpoint-to-ground voltage is lower than the pre-determined threshold, it indicates a no fault condition (block 96). The high side or the low side power electronic switches are then placed in their respective non conducting state and the ground fault status is reported with the system being ready for next cycle, as represented by block 98.

Figure 4:
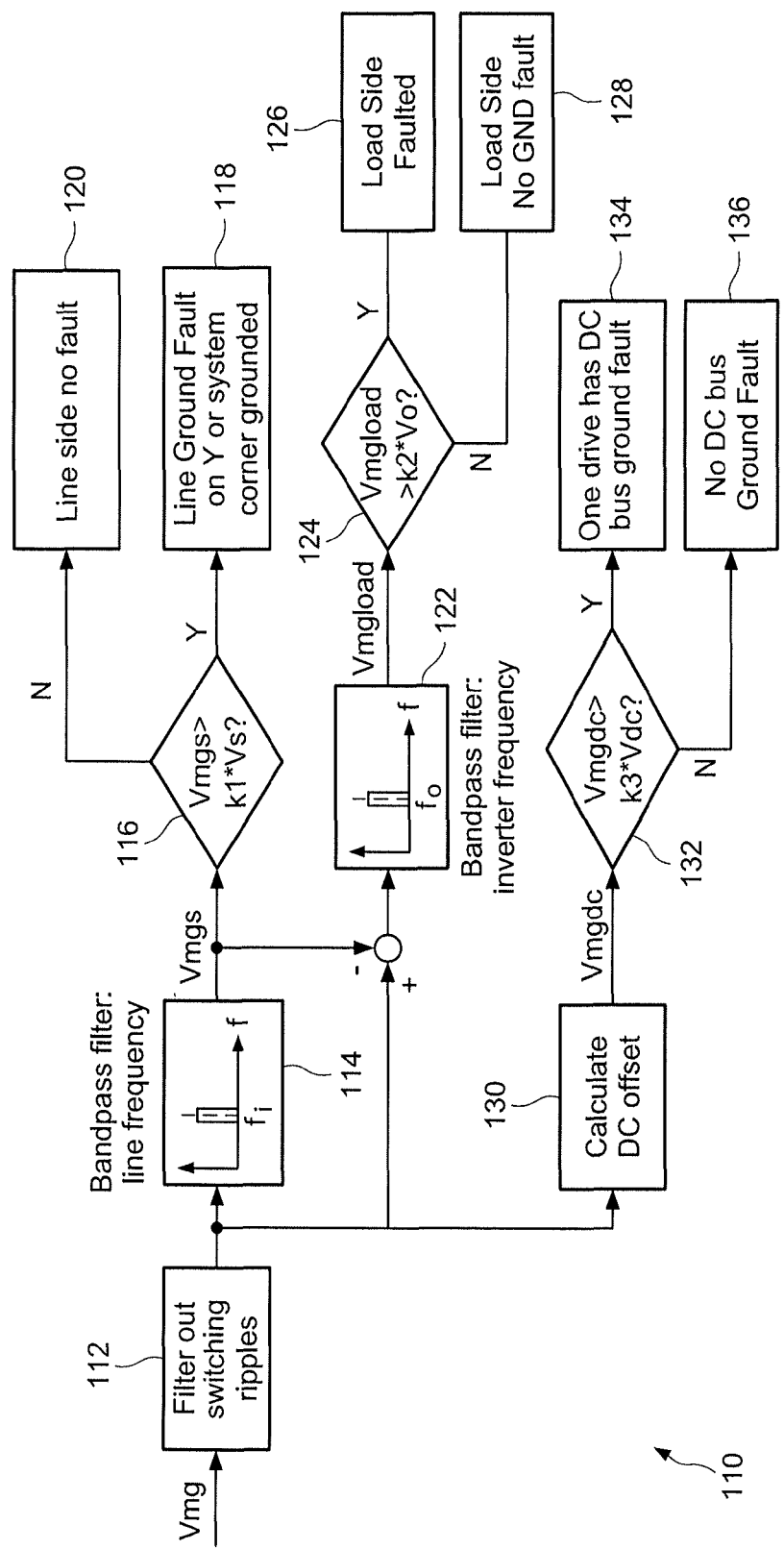
FIG. 4 illustrates exemplary process steps for detecting a high resistance fault in the voltage source power conversion circuit of FIG. 1 during powering a load of the circuit.

FIG. 4 illustrates exemplary process steps 110 for detecting a high resistance fault in the voltage source power conversion circuit 10 of FIG. 1 during driving the load 22. At block 112, switching ripples are filtered from measured a midpoint-to-ground voltage ($V_{mg}$). Further, a band pass filter is employed to detect a line side fundamental frequency component ($V_{mgs}$) of the midpoint-to-ground voltage (block 114). In this exemplary embodiment, the initial source grounding type is determined for the circuit 10 prior to measuring the midpoint-to-ground voltage. At block 116, the line side fundamental frequency component is compared with a first threshold. In this exemplary embodiment, the first threshold is a function of the source voltage ($V_s$) of the AC input and a first constant (k1). In certain exemplary embodiments, the first constant k1 is about 0.25 to about 0.75. In one exemplary embodiment, the first constant k1 is about 0.5.

If the line side fundamental frequency component is greater than the first threshold, then the system has a line side ground fault on a Y or corner grounded system (block 118). Alternatively, if the line side fundamental frequency component is lesser than the first threshold, then the system does not have a line side ground fault (block 120).

In this exemplary embodiment, another band pass filter with filtering frequency as the inverter frequency is employed to determine an output frequency component ($V_{mgload}$) (block 122). Furthermore, at block 124, the output frequency component is compared with a second threshold. In this exemplary embodiment, the second threshold is a function of the output voltage ($V_o$) and a second constant (k2). In certain exemplary embodiments, the second constant is about 0.25 to about 0.75. In one exemplary embodiment, the second constant k2 is about 0.5.

If the output frequency component is greater than the second threshold, then the system has a load side ground fault (block 126). Alternatively, if the output frequency component is lesser than the second threshold, then the system does not have a load side ground fault (block 128).

In this exemplary embodiment, the DC offset component ($V_{mgdc}$) of the midpoint-to-ground voltage is determined, as represented by block 130. At block 132, the DC offset component is compared with a third threshold. In this exemplary embodiment, the third threshold is a function of the bus voltage ($V_{dc}$) and a third constant (k3). In certain exemplary embodiments, the third constant is about 0.25 to about 0.75. In one exemplary embodiment, the third constant is about 0.5.

If the DC offset component is greater than the third threshold, then the system has a DC bus ground fault (block 134). Alternatively, if the DC offset component is lesser than the third threshold, then the system does not have a DC bus ground fault (block 136).

Figures 5, 6:
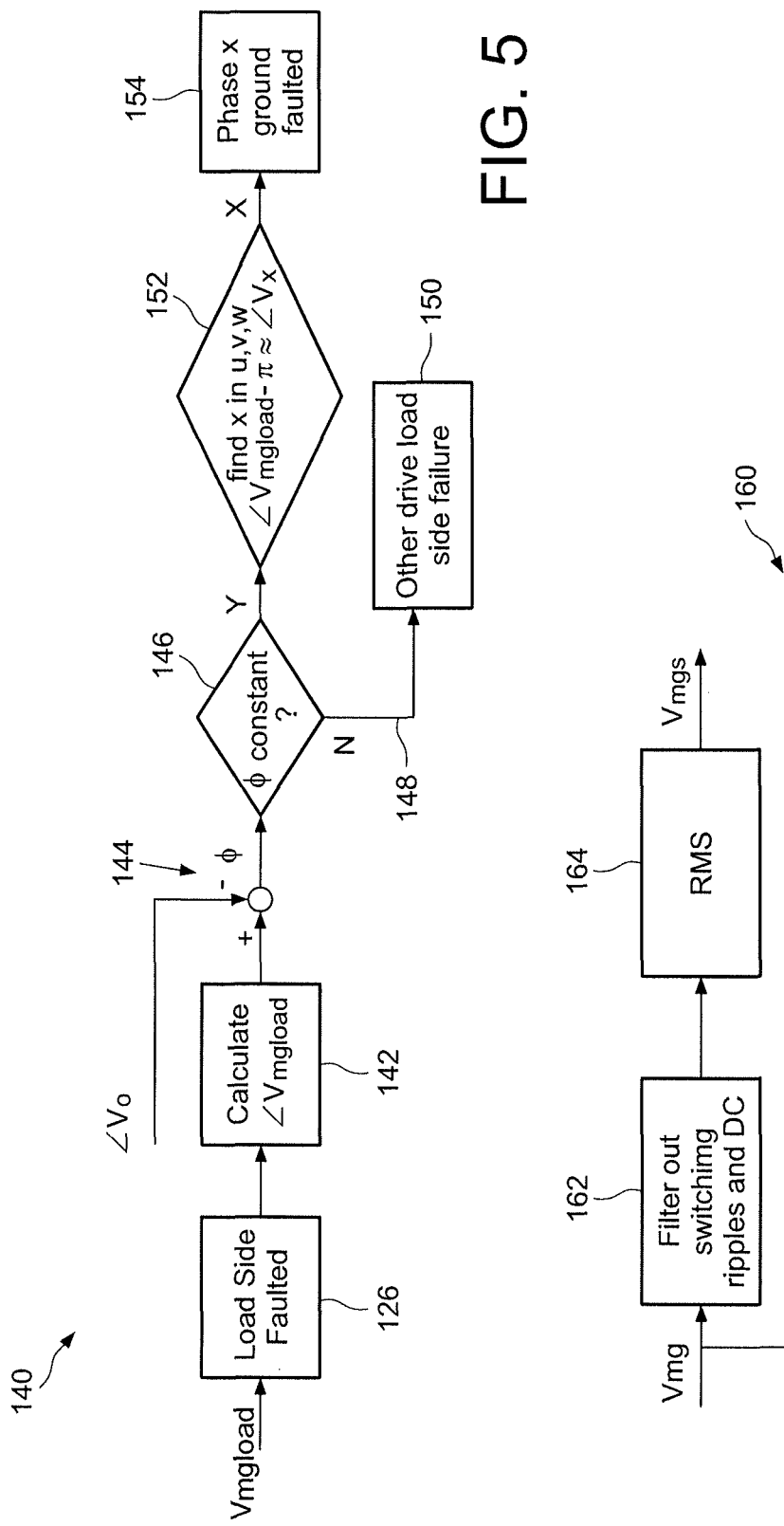
FIG. 5 illustrates exemplary process steps for detecting a location of a load side ground fault in a high resistance network using the output frequency component ($V_{mgload}$) of the midpoint-to-ground voltage estimated using the process of FIG. 4.
FIG. 6 illustrates another exemplary embodiment of detecting DC ground fault using the measured midpoint-to-ground voltage.

FIG. 5 illustrates exemplary process steps 140 for detecting a location of a load side ground fault in a high resistance network using the output frequency component ($V_{mgload}$) of the midpoint-to-ground voltage estimated using the process of FIG. 4. As illustrated, the load side ground fault is detected using the output frequency component of the midpoint-to-ground voltage (block 126). At block 142, a phase angle ($\angle V_{mgload}$) of the output frequency component of the midpoint-to-ground voltage is estimated. Furthermore, the estimated phase angle is combined with a phase angle ($\angle V_o$) of the inverter output voltage to determine a differential phase angle ($\phi$) (block 144).

At block 146, it is verified if the differential phase angle is a constant value. If the differential phase angle does not have a constant value (line 148), then it is indicative of load side ground fault for another drive of the system (block 150). Alternatively, if the differential phase angle exhibits a constant value, then the output frequency component of the midpoint-to-ground voltage is utilized to determine a respective phase angle for each phase of the drive indicative of the fault in the respective phase of the drive (blocks 152 and 154). In this exemplary embodiment, the phase angle is indicative of phase "x" of the drive being ground faulted.

FIG. 6 illustrates another exemplary embodiment 160 of detecting DC ground fault using the measured midpoint-to-ground voltage. In this exemplary embodiment, the midpoint-to-ground voltage ($V_{mg}$) signal obtained using the midpoint-to-ground voltage detection circuit of FIG. 1 is filtered to filter out switching ripples and DC signals (block 162). Further, a root mean square value is estimated to determine the magnitude of the fundamental frequency component ($V_{mgs}$) of the midpoint-to-ground voltage (block 164). Similarly, the midpoint-to-ground voltage ($V_{mg}$) signal is filtered to filter out switching ripples and DC signals (block 166) to determine the magnitude of the DC offset component ($V_{mgdc}$) of the midpoint-to-ground voltage.

In one exemplary embodiment, if the fundamental frequency component ($V_{mgs}$) is greater than a pre-determined threshold, then an AC ground fault signal is displayed. In another exemplary embodiment, if the DC offset component ($V_{mgdc}$) is greater than a pre-determined threshold, then a DC ground fault signal is displayed. Thus, this technique facilitates online detection of the AC and DC ground faults using the fundamental frequency component and the DC offset component of the midpoint-to-ground voltage.

As will be appreciated by those of ordinary skill in the art, the foregoing example, demonstrations, and process steps may be implemented by suitable code on a processor-based system, such as a general-purpose or special-purpose computer. It should also be noted that different implementations of the present technique may perform some or all of the steps described herein in different orders or substantially concurrently, that is, in parallel. Furthermore, the functions may be implemented in a variety of programming languages, such as C++ or JAVA.

Such code, as will be appreciated by those of ordinary skill in the art, may be stored or adapted for storage on one or more tangible, machine readable media, such as on memory chips, local or remote hard disks, optical disks (e.g., CD's or DVD's), or other media, which may be accessed by a processor-based system to execute the stored code. Note that the tangible media may comprise paper or another suitable medium upon which the instructions are printed. For instance, the instructions can be electronically captured via optical scanning of the paper or other medium, then compiled, interpreted or otherwise processed in a suitable manner if necessary, and then stored in a computer memory.

The various aspects of the structures described hereinabove may be used for detecting ground faults in high resistance ground systems such as motor drive systems. In particular, the technique described above utilizes a midpoint-to-ground voltage signal for detecting the presence and location of the ground fault in high resistance network. Advantageously, the technique facilitates offline and online identification of the ground fault in a high resistance network at the drive load side, DC bus side and the line side thereby enhancing the reliability of such systems.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system for detection of a ground fault in a high resistance ground network, comprising:

a voltage source power conversion circuit comprising a power converter that converts incoming AC power to DC power applied to a DC bus and an inverter that converts DC power from the DC bus to output AC power;

a midpoint-to-ground voltage detection circuit coupled to a low side of the DC bus and to a ground potential, wherein the midpoint-to-ground voltage detection circuit is configured to generate a midpoint-to-ground voltage signal; and a monitoring and analysis circuit coupled to the midpoint-to-ground voltage detection circuit and configured to detect a ground fault in a high resistance network based upon the midpoint-to-ground voltage signal prior to and during powering a load with the output AC power, and to detect a location of the ground fault in the high resistance network based upon a DC offset component and a frequency component of the midpoint-to-ground voltage signal;

wherein the monitoring and analysis circuit is configured to estimate a phase angle of the midpoint-to-ground voltage to detect a phase of a drive with the ground fault in the high resistance ground network.

2. The system of claim 1, wherein the midpoint-to-ground voltage detection circuit is coupled to a DC bus voltage measurement circuit.

3. The system of claim 2, wherein the midpoint-to-ground voltage detection circuit comprises an amplifier coupled to the low side of the DC bus to detect a voltage at a node between the low side of the DC bus and a ground potential, and a low pass filter coupled to an output of the amplifier to generate the midpoint-to-ground voltage signal.

4. The system of claim 1, wherein the monitoring and analysis circuit is configured to detect a load side ground fault, a DC bus ground fault, and a line side ground fault in the high resistance network.

5. The system of claim 1, wherein the monitoring and analysis circuit is configured to compare a line side fundamental frequency component of the detected midpoint-to-ground voltage with a first threshold to detect a line side ground fault during powering the load with the output AC power, wherein the first threshold is a function of a source voltage of the AC input power.

6. The system of claim 1, wherein the monitoring and analysis circuit is configured to compare an output frequency component of the detected midpoint-to-ground voltage during powering the load with a second threshold to detect a load side ground fault, wherein the second threshold is a function of an output voltage.

7. The system of claim 1, wherein the monitoring and analysis circuit is configured to compare a DC offset component of the midpoint-to-ground voltage with a third threshold to detect a DC bus ground fault during powering the load with the output AC power, wherein the third threshold is a function of the bus voltage.

8. The system of claim 1, wherein the monitoring and analysis circuit is configured to determine whether the detected midpoint-to-ground voltage exhibits a DC offset component indicative of a DC bus ground fault prior to powering the load with the output AC power.

9. The system of claim 1, wherein the monitoring and analysis circuit is configured to determine whether the detected midpoint-to-ground voltage exhibits a DC offset component indicative of a load side ground fault prior to powering the load with the output AC power.

10. The system of claim 1, wherein the monitoring and analysis circuit is configured to detect a line side ground fault based upon the frequency component of the midpoint-to-ground signal prior to powering the load with the output AC power.

\* \* \* \* \*